United States Patent [19]

Jellinek et al.

[11] Patent Number: 5,075,155

[45] Date of Patent: Dec. 24, 1991

[54] NOVEL PREPREGS

[75] Inventors: Karl Jellinek, Iserlohn; Berthold Meier, Menden; Horst Duda; Winfried Reisel, both of Iserlohn, all of Fed. Rep. of Germany

[73] Assignee: Rutgerswerke AG, Fed. Rep. of Germany

[21] Appl. No.: 524,350

[22] Filed: May 16, 1990

[30] Foreign Application Priority Data

May 16, 1989 [DE] Fed. Rep. of Germany ....... 3915823

[51] Int. Cl.$^5$ ................................................ B32B 9/00
[52] U.S. Cl. .................................. 428/209; 428/285; 428/304.4; 428/415; 428/901; 264/104; 156/60
[58] Field of Search ............. 428/209, 285, 415, 901, 428/304.4; 525/523; 523/443; 156/60; 427/96; 264/104

[56] References Cited

U.S. PATENT DOCUMENTS

| 3,838,094 | 9/1974 | Sporck | 523/443 |
| 4,029,845 | 6/1977 | Nomura | 428/415 |
| 4,477,512 | 10/1984 | Thomas et al. | 428/285 |
| 4,501,787 | 2/1985 | Marchetti et al. | 428/285 |
| 4,550,128 | 10/1985 | Chellis | 428/901 |
| 4,614,826 | 9/1986 | Katayama et al. | 525/523 |
| 4,710,429 | 12/1987 | Bogan et al. | 428/285 |

FOREIGN PATENT DOCUMENTS 0336360 10/1989 European Pat. Off. .

Primary Examiner—Patrick J. Ryan
Attorney, Agent, or Firm—Bierman and Muserlian

[57] ABSTRACT

A prepreg comprising a porous support material impregnated with a binder consisting essentially of an epoxy resin, a bisphenol novolac hardener and 0.4 to 2.0% by weight based on the total binder of an imidazole and a method of preparing laminates of composite materials therefrom.

10 Claims, No Drawings

NOVEL PREPREGS

STATE OF THE ART

Composite materials are flat structures comprising at least two layers of laminates and/or foils joined together and circuit boards are composite materials in which a laminate is joined on one or both sides with a metal foil, particularly a copper foil. For the production of these laminates, porous materials, particularly glass fabrics as e.g. U.S. Style 7628 of a weight of 200 g/m$^2$, are resin-coated with 40 to 45% of a duroplastic resin, preferably with an epoxy resin-based, binder. This is normally done by impregnating the glass fabric with an appropriate resin solution and drying the so-called prepreg to a defined prehardening degree. The laminates thus produced are normally cut, stacked, and hardened with copper foil between special steel sheets in multilayer presses under pressure and temperature. No special requirements are set for the hardening rate.

The situation is a different one in the continuous production in a dual belt press where the composite material, particularly the circuit boards, are made at a speed of up to 8 meters per minutes in a dual belt press wherein a avery high acceleration of the hardening system is necessary. DE-A 37 14 997 describes an appropriate binder consisting of epoxy resins, cyanamide and 2-methylimidazole as the accelerator. This binder forms with glass fabrics laminates of excellent physical and chemical properties. The fabric webs obtained as an intermediate stage in the laminate production, preimpregnated with resin but still fluid, so-called prepregs, will indeed harden very rapidly in the hot press. However, they do not store well at room temperature and will usually harden after a few days. It is therefore practically not possible to transport them from the prepreg manufacturer to the maker of the circuit boards. Moreover, the adhesion of the copper foil pressed on in the process leaves something to be desired.

OBJECTS OF THE INVENTION

It is an object of the invention to provide novel prepregs which will rapidly cure in a dual belt press but remain stable at room temperature for prolonged periods.

It is another object of the invention to provide an improved process for the preparation of laminates from composite materials and circuit boards produced therefrom.

These and other objects and advantages will become obvious from the following detailed description.

THE INVENTION

The novel prepregs of the invention are comprised of a porous support material impregnated with a binder consisting essentially of an epoxy resin, a bisphenol novolac hardener and 0.4 to 2.0% by weight based on the total binder of an imidazole. It has been surprisingly found that laminates produced from such prepregs have very good properties.

U.S. Pat. No. 4,501,787 describes the production of laminates by impregnating a porous support material with a binder consisting of an epoxy resin, a bisphenol-based novolac hardener and an imidazole as accelerator in which the imidazoles are added in small amounts of 0.15 to 0.21%, referred to the total of binder and solvent or flame protection agent, i.e. in a quantity sufficient to obtain good through-hardening under normal hardening of the composite materials in a platen press, while at the same time still preserving a good storage stability. However, such resin mixtures are not suitable for continuous laminate production in a dual belt press.

It has been surprisingly found that if the imidazole component is greatly increased to 0.4 to 2%, preferably to 0.5 to 1% by wt, referred to total binder, the hardening rate is increased more than proportionately. While an increase of the hardening rate was perfectly foreseeable by the specialist, although not to that extent, it is surprising that despite increased reactivity of the binder, the storage stability is not adversely influenced substantially. This means that both in the impregnating bath and in the impregnated laminates, no premature hardening of the binder is observed. The prepregs are stable at room temperature up to 3 months without quality loss occurring due to a partial continued hardening of the binder. Upon subsequent drilling, etching and through-connecting in electrolytic baths, the finished composite materials show no discoloration or disturbing resin residues in the drill holes and the adhesion of the metal layers at the drill hole walls proves perfectly satisfactory.

Examples of epoxy resin are all commercial epoxy resins as listed e.g. in the Handbook of Epoxy Resins by Lee et al. For many uses, flame-resistant composite materials per NEMA Specification FR IV are preferred. Suitable impregnating solutions are those on the basis of the oligomeric resins known per se obtained by chain extension of bisphenol A-diglycidyl ether with tetrabromobisphenol and/or bisphenol A, with epoxide equivalents of 250 to 500 g/equivalent, preferable 250 to 450 g, referred to the solid resin content.

Examples of hardener component are novolac resins of selected bisphenols which are produced by polycondensation with formaldehyde in the molar ratio of 1:0.5 to 0.95, using the usual acid condensation catalysts such as oxalic acid, phosphoric acid or sulfuric acid. Suitable bisphenols for the production of novolac resins used as hardener components for the invention are compounds of the formula:

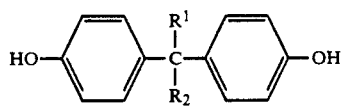

wherein $R_1$ and $R_2$ are individually alkyl of 1 to 4 carbon atoms such as $CH_3-$, $C_2H_5-$, $C_3H_7-$ or $C_4H_9-$. The amount of bisphenol novolac used is in the range of 5 ot 40% by wt, referred to total binder, with smaller amounts of novolac being chosen at higher epoxy resin equivalent weights.

The above-mentioned mixtures of the oligomeric epoxy resins and the bisphenol novolac resins are adjusted to high reactivity with 0.4 to 2.0%, preferably 0.5 to 1.5%, and more preferably 0.6 to 0.8%, by weight (referred to total binder) of imidazoles. Preferably the acceleration is so great that thickening times (so-called B times) on the flat plate at 170 C. for example will then be at least 5 days.

Examples of imidazole compounds which may be used are in principle all imidazoles known as hardening accelerators for epoxy resins such as imidazole, 2-phenyl imidazole, 2-methyl imidazole, 1-methyl imidazole, 2-ethyl-4-methyl imidazole as well as their reaction products with ethylene oxide, propylene oxide or acrylonitrile.

A further novel feature of these oligomeric epoxy resins, usually adjusted to be flame-retarding, hardened with bisphenol novolac resins, appears in the processing of the copper-backed circuit boards. The systems of the invention show, as a complete surprise, a substantially more favorable behavior upon drilling and through-connecting of the resulting drill holes after the preceding etching process. There occurs neither the undesirable discoloration of the circuit boards, nor the frequently encountered difficulty of the complete removal of drill dust (smear) predominantly swelled like gel. Removal of drill dust is possible without any problem in the circuit boards produced from the prepregs of the invention without adhering gel particles on the drilled surfaces, and immediately leads to smooth drill hole surfaces whereby a satisfactory through-connection is made possible.

The binders to be used in the invention can be processed either as 50 to 90% solutions in normal impregnating installations, or as so-called high-solid systems with solids components of 90 to 99.5%, or respectively as solids mixtures possibly with addition of up to 8% solvent on melt rolls, melt calanders or tape installations to glass fabric prepregs.

In the following examples these are described several preferred embodiments to illustrate the invention. However, it is to be understood that the invention is not intended to be limited to the specific embodiments.

EXAMPLES

In Examples 1 to 12, resin solutions with different resins and different accelerator components were produced and the percentages are given in per cent by weight. Examples 1 to 3 were according to the invention and Examples 4 to 12, comparison examples. The processability time of the resins is determined in that 10 liters of the resin solution were stored at 25 C. with testing each day whether the solution is still suitable for the impregnation of glass fabrics or whether it had already aged too much. The results are reported in Table I.

Moreover, the so-called B-times at 170° C. and 150° C. were measured by the following method: After mixing for 15 minutes or respectively 25 minutes, 1 ml of the resin mixture was placed on the flat heating plate and using a glass rod, was stirred at an angle of 60 degrees until the resin was gelled and tore off when the glass rod was lifted. The time from charging the resin solution to the gelling point was determined and recorded as B-time. The values obtained are contained in Table II.

EXAMPLE I

A resin solution was prepared having a 75% solids content in a mixture of methyl ethyl ketone and 1-methoxypropanol-2(1:1). A mixture of 78% of a bisphenol A- and tetrabromobisphenol A-based epoxy resin with an epoxide equivalent of 320 and a bromine content of 25% and 22% of a bisphenol A-based novolac with a molar ratio of bisphenol A to formaldehyde of 1:0.7 prepared by acid condensation were dissolved in the resin solution. The solution was mixed with 0.5% of 2-ethyl-4-methyl imidazole, based on the solid resin component, and was diluted with methyl ethyl ketone to a resin content of 58%.

EXAMPLE 2

A solution of Example 1, but containing 1.0% of 2-ethyl-4-methyl imidazole, based on the solid resin component was prepared.

EXAMPLE 3

A solution of Example 1, but containing 2.0% 2-ethyl-4-methyl imidazole, based on the solid resin component was prepared.

EXAMPLE 4

To a commercial FR-4 resin solution (Rutapox VE 3579) with a resin content of 75%, epoxy resin with an epoxide equivalent of 400±20, a bromine content of 20±1 and a viscosity at 25° C. of 500±150 mPa s was added 3% of dicyandiamide in the form of a 10% solution in methylglycol, based on the solid resin content of the resin solution, as hardener. 0.5% of 2-ethyl-4-methyl imidazole, based on the solid resin content, was added and the solution was diluted with methyl ethyl ketone to a resin content of 58%.

EXAMPLE 5

A solution of Example 4, but containing 1.0% of 2-ethyl-4-methyl imidazole, based on the solid resin component, was prepared.

EXAMPLE 6

A solution of Example 4, but containing 2.0% of 2-ethyl-4-methyl imidazole, based on the solid resin component, was prepared.

EXAMPLE 7

A solution of Example 1, but containing 0.5% of benzyldimethylamine (BDMA) instead of the imidazole, was prepared.

EXAMPLE 8

A solution of Example 7, but containing 1.0% of BDMA, was prepared.

EXAMPLE 9

A solution of Example 7, but containing 2.0% of BDMA, was prepared.

EXAMPLE 10

A solution of Example 4, but containing 0.5% of BDMA instead of the imidazole, was prepared.

EXAMPLE 11

A solution of Example 10, but containing 1.0% of BDMA, was prepared.

EXAMPLE 12

A solution of Example 10, but containing 2.0% of BDMA, was prepared.

TABLE I

| Example | End of processability time after in days |
|---|---|
| 1 | 21 |
| 2 | 20 |
| 3 | 12 |
| 4 | 5 |
| 5 | 3 |
| 6 | 3 |
| 7 | 6 |
| 8 | 4 |

TABLE I-continued

| Example | End of processability time after in days |
|---|---|
| 9 | 3 |
| 10 | 5 |
| 11 | 3 |
| 12 | 2 |

TABLE II

Determination of the B-times

| | at 170° C. | | at 150° C. | |
|---|---|---|---|---|
| Example | After 15 minutes | After 14 days at 25° C. | After 25 minutes | After 14 days at 25° C. |
| 1 | 75 | 68 | 165 | 153 |
| 2 | 48 | 43 | 106 | 95 |
| 3 | 36 | 31 | 78 | 64 |
| 4 | 78 | 71 | 165 | 145 |
| 5 | 52 | 46 | 120 | 95 |
| 6 | 42 | B-state | 90 | B-state |
| 7 | 133 | 120 | 310 | 241 |
| 8 | 80 | 65 | 180 | 150 |
| 9 | 47 | 42 | 110 | 70 |
| 10 | 175 | 120 | 300 | 240 |
| 11 | 110 | 90 | 200 | 150 |
| 12 | 75 | B-state | 135 | B-state |

EXAMPLE 13

With the solutions of Examples 1 to 8, impregnation batches of glass fabric of type U.S.-Style 7628 was resin-coated with Finish Z 6040 and dried in the drying oven. The resin content was 40 to 45% and the resin flow was 8 to 10%. Eight layers of the resin-coated fabric were pressed in a press for 60 minutes at 170° C. under pressure to form a composite material. The laminates thus obtained were tested for their physical properties relevant to electrical application, and Table III shows the measured values.

TABLE III

Properties of a laminate plate (1.6 mm)

| Properties | Unit | Example 1 | Example 2 | Example 3 |
|---|---|---|---|---|
| Surface resistance | Ω | $2 \times 10^{12}$ | $2 \times 2 \times 10^{12}$ | $2.3 \times 10^{12}$ |
| Volume resistance | Ω·cm | $5 \times 10^{14}$ | $4.9 \times 10^{14}$ | $5.3 \times 10^{14}$ |
| Dielectric constant $e_r$ MHz | — | 4.7 | 4.7 | 4.7 |
| Dielectric loss factor tan δ MHz | — | 0.015 | 0.016 | 0.014 |
| El. breakdown voltage | KV | >50 | >50 | >50 |
| Bending strength, longitudinal | N/mm² | 500 | 550 | 495 |
| transverse | | 400 | 410 | 385 |
| Copper adhesivity 35 m/u Cu foil | N/mm | >1.4 | >1.4 | >1.4 |
| Solder bath resistance at 260° C. | s | >180 | >180 | >180 |
| Solder bath resistance at 260° C. after "Pressure Cooker Test" | | passed without delaminations | passed without delaminations | passed without delaminations |
| Water absorption | mg | 7.0 | 6.5 | 7.2 |
| Flammability acc. to UL 94 | Class | V–0 | V–0 | V–0 |
| Absorption of N-methylpyrrolidone 0.4 (NMP) | % | 0.4 | 0.3 | 0.4 |
| Glass transition point $T_G 50$ | °C. | 142 | 139 | 143 |

EXAMPLE 14

Using the procedure of Example 13, laminates were made and tested with the solutions (impregnation batches) prepared in Examples 4 to 6, and the values obtained are contained in Table IV.

TABLE IV

Properties of a laminate plate (1.6 mm)

| Properties | Unit | Example 4 | Example 5 | Example 6 |
|---|---|---|---|---|
| Surface resistance | Ω | $3 \times 10^{12}$ | $3.1 \times 10^{12}$ | $3.2 \times 10^{12}$ |
| Volume resistance $8.2 \times 10$ | Ω·cm | $8 \times 10^{14}$ | $8.1 \times 10^{12}$ | $8.2 \times 10^{12}$ |
| Dielectric constant $e_r$ 1 MHz | — | 4.8 | 4.8 | 4.8 |
| Dielectric loss factor tan 1 MHz | — | 0.015 | 0.015 | 0.015 |
| El. breakdown voltage | KV | >50 | >50 | >50 |
| Bending strength, longitudinal | N/mm² | 500 | 540 | 495 |
| transverse | N/mm² | 400 | 435 | 390 |
| Copper adhesivity 35 m/u Cu foil | N/mm | 1.4 | 1.4 | 1.4 |
| Solder bath resistance at 260° C. | s | >180 | >180 | >180 |

TABLE IV-continued

| Properties of a laminate plate (1.6 mm) | | | | |
|---|---|---|---|---|
| | | Value | | |
| Properties | Unit | Example 4 | Example 5 | Example 6 |
| Solder bath resistance at 260° C. after "Pressure Cooker Test" | | passed without de-laminations | passed without de-laminations | passed without de-laminations |
| Water absorption | mg | 10 | 8.5 | 9.8 |
| Flammability acc. to UL 94 | Class | V-0 | V-0 | V-0 |
| Absorption of N-methylpyrolidone (NMP) | % | 0.6 | 0.5 | 0.6 |
| Glass transition point $T_G 50$ | °C. | 133 | 135 | 138 |

A comparison of the values obtained for Examples 1 to 3 of Table III with the values of Examples 4 to 6 of Table IV clearly show the improved properties of the prepregs of the invention.

Various modifications of the products and method of the invention may be made without departing from the spirit or scope thereof and it is to be understood that the invention is intended to be limited only as defined in the appended claims.

What I claim is:

1. A prepreg comprising a porous support material impregnated with a binder consisting essentially of an epoxy resin, 5 to 40% by weight of a bisphenol novolac hardener based on the total binder weight and 0.4 to 2.0% by weight based on total binder of an imidazole.

2. A prepreg of claim 1 containing 0.7 to 1.0% by weight of an imidazole.

3. A prepreg of claim 1 wherein the bisphenol for the novolac hardener has the formula

wherein $R_1$ and $R_2$ are individually lower alkyl of 1 to 4 carbon atoms.

4. A prepreg of claim 1 wherein the imidazole is selected for the group consisting of imidazole, 2-phenyl-imidazole, 2-methyl-imidazole, 1-methyl-imidazole and 2-ethyl-4-methyl-imidazole and their reaction products with ethylene oxide, propylene oxide or acetonitrile.

5. A method for the continuous production of composite materials based on epoxy resin laminates by heating prepregs in a heated dual belt press, the improvement comprising using as the prepreg a prepreg of claim 1.

6. The method of claim 5 wherein the binder contains 0.7 to 1% by weight of an imidazole.

7. The method of claim 5 wherein the binder contains 5 to 40% by weight % of bisphenol-based novolac.

8. The method of claim 5 wherein the continuous laminate production occurs at temperatures of 170° to 230° C.

9. The method of claim 8 wherein the temperature is 190° to 220° C.

10. A composite material circuit board prepared from a laminate product by the process of claim 5.

* * * * *